US006524954B1

United States Patent
Bakli et al.

(10) Patent No.: US 6,524,954 B1
(45) Date of Patent: *Feb. 25, 2003

(54) REDUCTION OF TUNGSTEN SILICIDE RESISTIVITY BY BORON ION IMPLANTATION

(75) Inventors: Mouloud Bakli, Crolles (FR); Herve Monchoix, Grenoble (FR); Denis Sauvage, Aix-en-Provence (FR)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/188,758

(22) Filed: Nov. 9, 1998

(51) Int. Cl.[7] .................................. H01L 21/44
(52) U.S. Cl. ....................... 438/659; 438/660
(58) Field of Search ................. 438/659, 658, 438/660, 914

(56) References Cited

U.S. PATENT DOCUMENTS 5,459,101 A * 10/1995 Fujii et al. ............... 437/200
5,943,592 A * 8/1999 Tsukamoto et al. ....... 438/486

OTHER PUBLICATIONS

S. Nygren, D.T. Amm, D. Levy, J. Torres, G. Goltz, T.T. d'Ouville, P. Delpech. Dual–type CMOS gate electrodes by dopant diffusion from silicide. IEEE Transactions on Electron Devices, vol. 36, Issue 6. Jun. 1989. pp. 1087–1093.*

* cited by examiner

Primary Examiner—Olik Chaudhuri
Assistant Examiner—Ginette Peralta
(74) Attorney, Agent, or Firm—Blakely Sokoloff Taylor & Zafman

(57) ABSTRACT

A method for reducing the resistivity in a gate electrode is described. In one embodiment of the present invention, a silicon layer is formed on a substrate. A tungsten silicide layer is then formed on the silicon layer. The tungsten silicide layer is implanted with boron ions and an anneal is performed. The tungsten silicide layer and silicon layer are then patterned to form a gate electrode.

24 Claims, 5 Drawing Sheets

REDUCTION OF TUNGSTEN SILICIDE RESISTIVITY BY BORON ION IMPLANTATION

BACKGROUND OF THE INVENTION

1. Field of the Invention

This invention relates to the field of semiconductor devices, and more specifically, to a process for reducing silicide resistivity.

2. Background Information

In the manufacture of semiconductor devices it has become increasingly more important to develop devices that are smaller and more dense while increasing the speed and performance of such devices. Speed of the devices, for example transistors, often depend upon the polysilicon gate electrodes. The size, thickness, length, and material making up the gate electrode all affect the speed of the transistor in one way or another.

Tungsten silicide ($WSi_2$) is a material that has been used in the manufacture of gate electrodes in semiconductor devices, for example DRAM devices. Tungsten silicide is used to reduce the line resistance in polysilicon gate structures. Reducing the line resistance decreases the switching time of the transistor and thereby increases the speed of the transistor.

Most manufacturers use a standard approach to the formation of the tungsten silicide gate electrode. First, a thin gate oxide layer 110 is formed on a substrate 100, as illustrated in FIG. 1a. Then a layer of polysilicon 120 is deposited on thin gate oxide layer 110, as illustrated in FIG. 1b. Next a layer of tungsten silicide 130 is deposited on the polysilicon layer 120, as illustrated in FIG. 1c. An anneal is performed in order to improve the surface quality of the tungsten silicide layer 130. Finally, the tungsten silicide layer 130, the polysilicon layer 120, and gate oxide layer 110 are all patterned into a gate electrode 140 using well known photolithographic patterning techniques, as illustrated in FIG. 1d. It should be noted that photolithographic patterning techniques are well known in the art and are therefore not discussed in detail herein.

By using the above described standard approach for forming tungsten silicide on a polysilicon gate, manufacturers are able to produce gate electrodes with resistivities as low as approximately 17 micro-ohm per centimeter ($\mu$-ohm/cm). Such gate electrode resistivities increase the speed of the transistors, however, faster and faster devices are needed in order to keep up with current trends in the industry.

Thus, what is needed is a method and apparatus that decreases the resistivity in gate electrodes further, thereby increasing the speed of the semiconductor device.

SUMMARY OF THE INVENTION

A method for reducing the resistivity in a gate electrode is described. A silicon layer is formed on a substrate. A tungsten silicide layer is then formed on the silicon layer. The tungsten silicide layer is implanted with boron ions and an anneal is performed. The tungsten silicide layer and silicon layer are then patterned to form a gate electrode.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which.

DETAILED DESCRIPTION

A method for reduction of tungsten silicide resistivity by boron ion implantation is disclosed. In the following description, numerous specific details are set forth such as specific materials, parameters, methods, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

The present invention is a method for reducing the resistivity of tungsten silicide gate electrodes by implantation of boron ions into the tungsten silicide layer. Implanting boron ions into the tungsten silicide layer decreases the line resistance of the polysilicon gate and thereby increases the speed of the transistor.

FIGS. 2a–2d illustrate one embodiment of the present invention. FIG. 3 illustrates a flow chart of the process steps that correspond to the embodiment of the present invention illustrated in FIGS. 2a–2d.

Figure 1A:
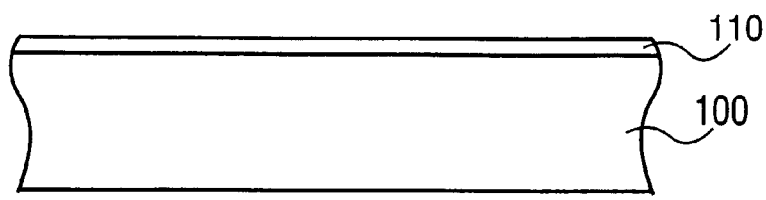
FIG. 1a illustrates a cross-sectional view of a substrate having a gate oxide formed thereon.
Figure 1B:
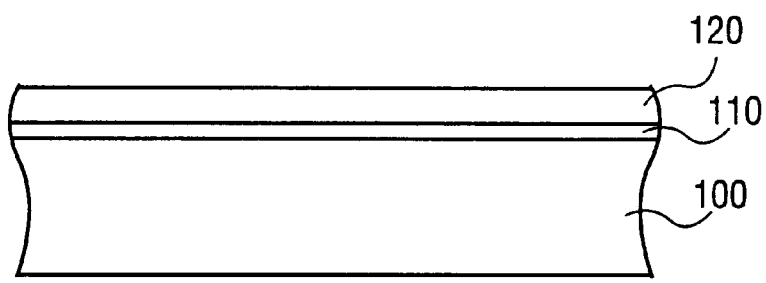
FIG. 1b illustrates a cross-sectional view of the structure of FIG. 1a having a polysilicon layer deposited thereon.
Figure 1C:
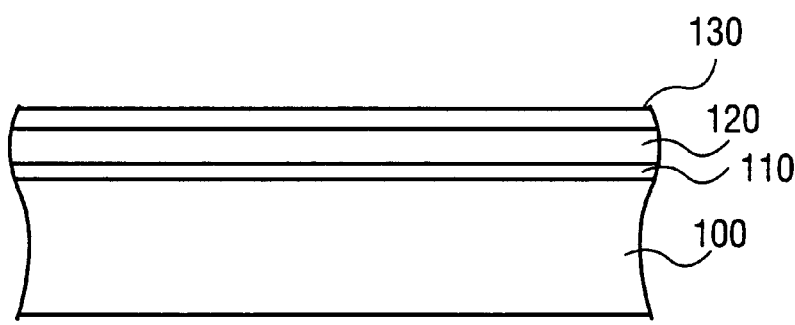
FIG. 1c illustrates a cross-sectional view of the structure of FIG. 1b having a tungsten silicide layer deposited thereon.
Figure 1D:
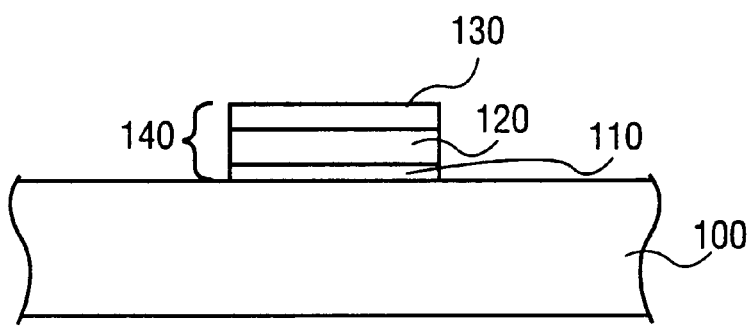
FIG. 1d illustrates a cross-sectional view of the structure of FIG. 1c after patterning into a gate electrode.
Figure 2A:
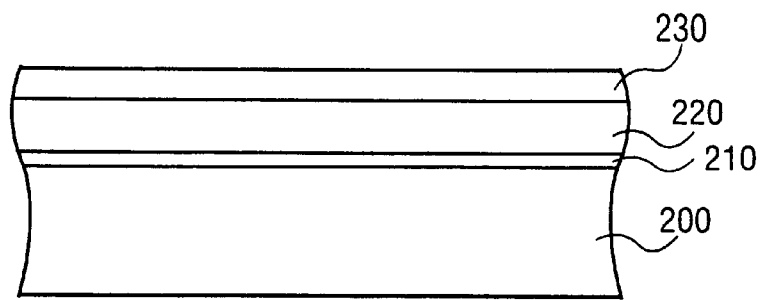
FIG. 2a illustrates a cross-sectional view of a substrate having a gate oxide, a silicon layer, and a tungsten silicide layer formed thereon.
Figure 3:
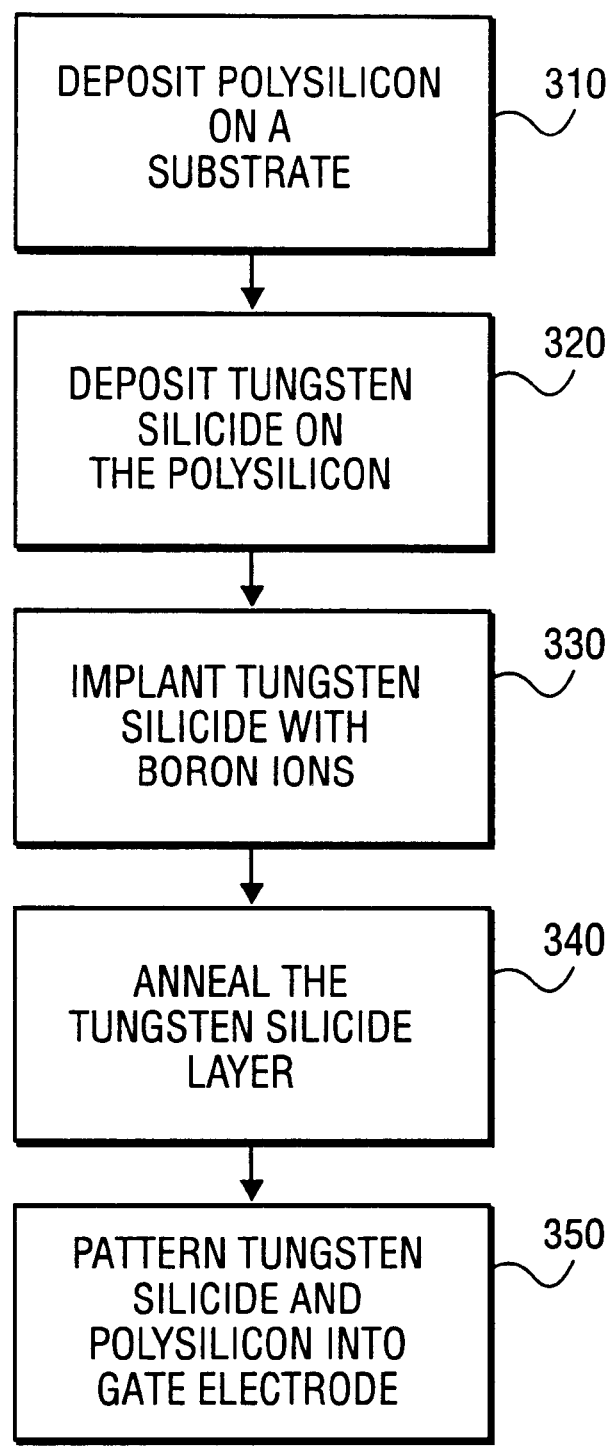
FIG. 3 illustrates a flow chart of the process steps for one embodiment of the present invention that corresponds to the process illustrated in FIGS. 2a–2d.

FIG. 2a illustrates a substrate 200 having a thin gate oxide 210 formed thereon. Next as discussed in FIG. 3, at step 310, a silicon layer 220 is deposited above the thin gate oxide layer 210. In one embodiment of the present invention silicon layer 220 is a polysilicon layer. At step 320, a tungsten silicide layer 230 is deposited on top of the polysilicon layer 220. Tungsten silicide layer 230 may be deposited to a thickness in the range of approximately 1–2.5 kÅ. In one embodiment of the present invention the tungsten silicide layer 230 is deposited to a thickness in the range of approximately 2–2.4 kÅ. It should be noted that the tungsten silicide thickness is fixed by the technology and design rules that are employed in the design technology. Thus moving to denser circuitry will require decreasing the tungsten silicide thickness.

Figure 2B:
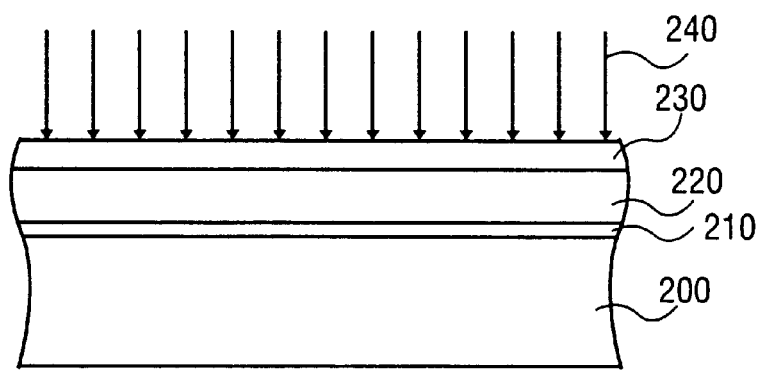
FIG. 2b illustrates a cross-sectional view of the structure of FIG. 2a during a dopant implantation step according to one embodiment of the present invention.

According to one embodiment of the present invention at step 330, tungsten silicide layer 230 is implanted with boron ions, as is illustrated in FIG. 2b. The boron ions are implanted into the tungsten silicide layer with an implantation energy in the range of approximately 20–100 keV. In one embodiment of the present invention the boron ions are implanted with an implantation energy in the range of approximately 27–33 keV. The boron ions are implanted into the tungsten silicide layer with a dose in the range of approximately $1\times10^{12}$–$1\times10^{15}$ atoms/cm$^2$. In one embodiment of the present invention the boron ions are with a dose in the range of approximately $0.9\times10^{14}$–$1.1\times10^{14}$ atoms/cm$^2$.

Implanting tungsten silicide layer 230 reduces the resistivity of the gate electrode that is to be formed using tungsten silicide layer 230, silicon layer 220, and gate oxide 210. Using boron ions reduces the resistivity even further than the resistivity levels achieved using just tungsten silicide. Reducing the resistivity the tungsten silicide layer results in higher conductivity for the gate electrode which in turn increases the speed of the device.

It is believed that the resistivity of the tungsten silicide layer is reduced by boron ion implantation due to the reactant nature of the boron ions. After the boron ions are implanted an anneal step is performed. During the anneal step it is believed that the boron reacts with the fluorine content of the tungsten silicide layer and outdiffuses in the stable form of boron fluoride (BF$_2$). In other words, the boron reduces the fluorine (i.e. impurities) in the tungsten silicide layer leaving behind a purer tungsten silicide material that has a lower resistivity and consequently a greater conductivity.

Figure 2C:
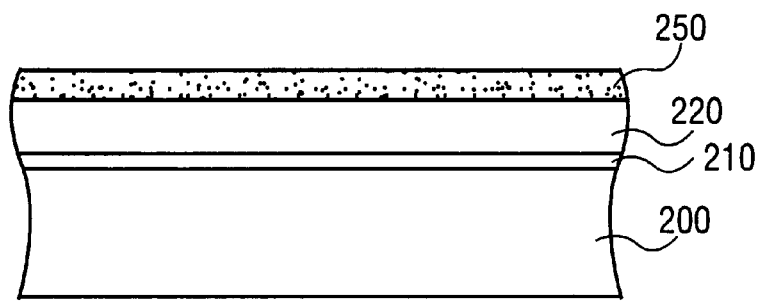
FIG. 2c illustrates a cross-sectional view of the structure of FIG. 2b after the dopant implantation and annealing steps according to one embodiment of the present invention.

At step 340, an anneal is performed. As previously discussed an anneal may be performed in order to improve the surface quality of a regular tungsten silicide layer 130. However, in the present invention, it is necessary to perform the anneal due to the damage caused to the doped tungsten silicide layer 250 by the dopant implantation. It is also necessary in the present invention to anneal the doped tungsten silicide layer 250 to cause the dopants to modify the tungsten silicide layer. The modified doped tungsten silicide layer has a lower resistivity than could previously be achieved just using a regular undoped tungsten silicide layer. FIG. 2c illustrates the doped tungsten silicide layer 250 after the anneal has been performed. In one embodiment of the present invention the anneal is performed in a nitrogen ambient (for example, N$_2$) with approximately 10 percent oxygen (i.e., N$_2$+10% O$_2$), at a temperature of approximately 900° C., for approximately 30 minutes.

Figure 2D:
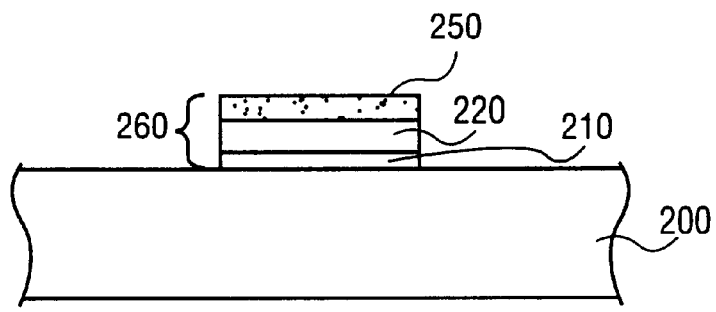
FIG. 2d illustrates a cross-sectional view of the structure of FIG. 2c after patterning into a gate electrode.

Finally at step 350, the doped tungsten silicide layer 250, polysilicon layer 220, and gate oxide layer 210 are patterned into a gate electrode 260, as is illustrated in FIG. 2d. It should be noted that any process for patterning may be used to pattern the gate electrode 260 and that patterning processes, for example photolithographic patterning, are well known in the art and are therefore not discussed in detail herein.

FIGS. 4a–4d illustrate another embodiment of the present invention. FIG. 5 illustrates a flow chart of the process steps that correspond to the embodiment of the present invention illustrated in FIGS. 4a–4d. It should be noted that a majority of the process steps in the embodiment illustrated in FIGS. 4a–4d are the same or similar to those discussed above with respect to the embodiment of the present invention illustrated in FIGS. 2a–2d with the exception that in the embodiment illustrated in FIGS. 4a–4d the gate electrode is patterned prior to the step of implanting dopants into the tungsten silicide layer and prior to annealing the doped tungsten silicide layer. Thus, many of the details are repeated below simply for clarity purposes.

Figure 4A:
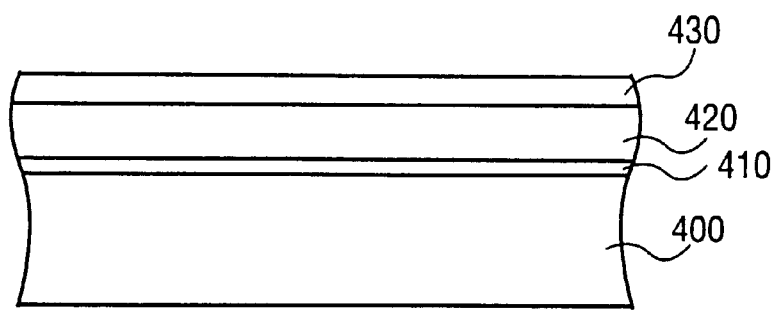
FIG. 4a illustrates a cross-sectional view of a substrate having a gate oxide, a silicon layer, and a tungsten silicide layer formed thereon.
Figure 5:
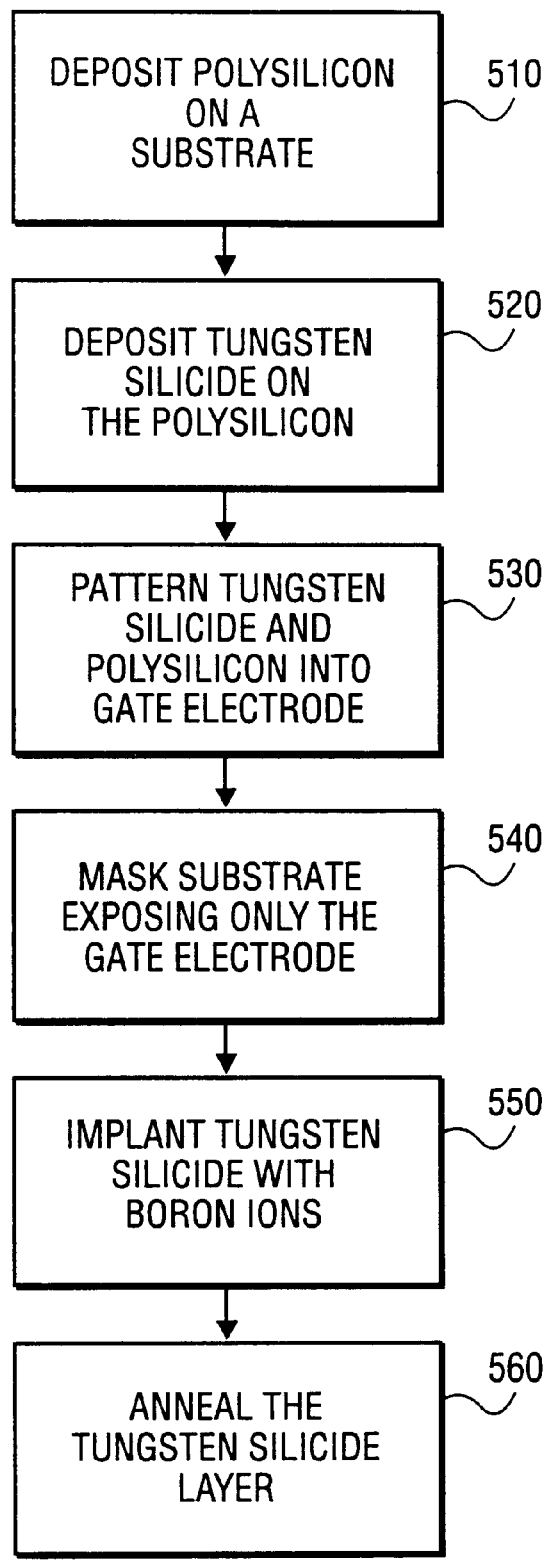
FIG. 5 illustrates a flow chart of the process steps for one embodiment of the present invention that corresponds to the process illustrated in FIGS. 4a–4d.

FIG. 4a illustrates a substrate 400 having a thin gate oxide 410 formed thereon. Next as discussed in FIG. 5, at step 510, a silicon layer 420 is deposited above the thin gate oxide layer 410. In one embodiment of the present invention silicon layer 420 is a polysilicon layer. At step 520, a tungsten silicide layer 430 is deposited on top of the polysilicon layer 420. Tungsten silicide layer 430 may be deposited to a thickness in the range of approximately 1–2.5 kÅ. In one embodiment of the present invention the tungsten silicide layer 430 is deposited to a thickness in the range of approximately 2–2.4 kÅ.

Figure 4B:
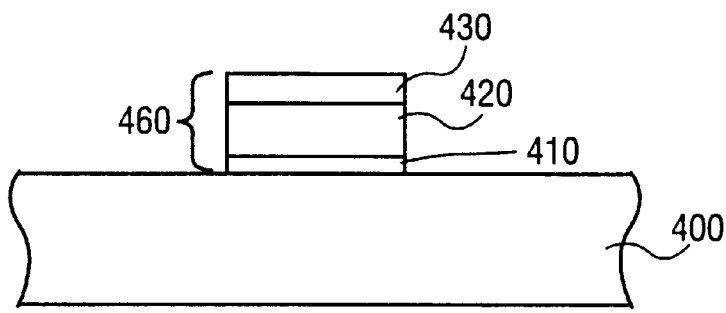
FIG. 4b illustrates a cross-sectional view of the structure of FIG. 4a after patterning into a gate electrode.

At step 530, the (undoped) tungsten silicide layer 430, polysilicon layer 420, and gate oxide layer 410 are patterned into a gate electrode 460, as is illustrated in FIG. 4b. It should be noted that any process for patterning may be used to pattern the gate electrode 460 and that patterning processes, for example photolithographic patterning, are well known in the art and are therefore not discussed in detail herein.

Figure 4C:
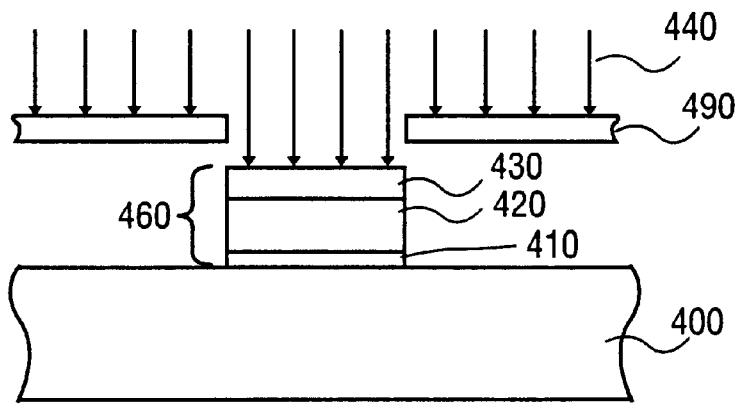
FIG. 4c illustrates a cross-sectional view of the structure of FIG. 4b during a dopant implantation step according to another embodiment of the present invention.

According to this embodiment of the present invention, at step 540, the substrate 400 is masked leaving only the gate electrode structure 460 exposed. FIG. 4c illustrates an example of a mask 490 that exposes the gate electrode 460 while protecting the remainder of substrate 400 from the implantation of the boron ions. It should be noted that the mask 490 may be sized such that all of the gate electrode 460 is exposed or such that only a portion of the gate electrode is exposed, however, the greater the exposure the more even the implantation of the dopants. It should also be noted that masking techniques are well known in the art and are therefore not described in detail herein.

At step 550, the exposed portion of the tungsten silicide layer 430 is implanted with boron ions, as is illustrated in FIG. 4c. The boron ions are implanted into the tungsten silicide layer with an implantation energy in the range of approximately 20–100 keV. In one embodiment of the present invention the boron ions are implanted with an implantation energy in the range of approximately 27–33 keV. The boron ions are implanted into the tungsten silicide layer with a dose in the range of approximately $1\times10^{12}$–$1\times10^{15}$ atoms/cm$^2$. In one embodiment of the present invention the boron ions are with a dose in the range of approximately $0.9\times10^{14}$–$1.1\times10^{14}$ atoms/cm$^2$.

Implanting tungsten silicide layer 430 reduces the resistivity of the gate electrode 460 that has been formed from tungsten silicide layer 430, silicon layer 420, and gate oxide 410. Using boron ions reduces the resistivity even further than the resistivity levels achieved using just tungsten silicide. Reducing the resistivity the tungsten silicide layer results in higher conductivity for the gate electrode which in turn increases the speed of the device.

Figure 4D:
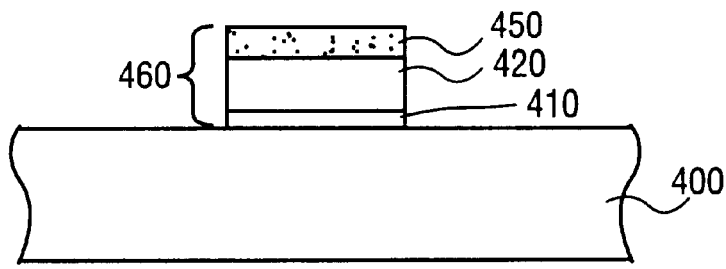
FIG. 4d illustrates a cross-sectional view of the structure of FIG. 4c after the dopant implantation and annealing steps according to one embodiment of the present invention.

At step 560, an anneal is performed. As previously discussed an anneal may be performed in order to improve the surface quality of a regular tungsten silicide layer 130. However, in the present invention, it is necessary to perform the anneal due to the damage caused to the doped tungsten silicide layer 450 by the dopant implantation. It is also necessary in the present invention to anneal the doped tungsten silicide layer 450 to cause the dopants to modify the tungsten silicide layer. The modified doped tungsten silicide layer has a lower resistivity than could previously be achieved just using a regular undoped tungsten silicide layer. FIG. 4*d* illustrates the gate electrode 460 having the doped tungsten silicide layer 450 after the anneal has been performed.

The present invention has the capability of improving resistivity reduction by up to approximately 15–20 percent over the prior standard technique described in the background of the invention. By implanting the tungsten silicide layer with dopants as described above, gate electrodes with resistivities as low and even lower than approximately 10 micro-ohms per centimeter ($\mu$-ohm/cm) can be achieved. Such gate electrode resistivities increase the speed of the transistors and help keep up with current trends in the industry.

Thus, a method for reduction of tungsten silicide resistivity by boron ion implantation has been described. Although specific embodiments, including specific equipment, parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A method for reducing resistivity of an electrode comprising:

forming a silicon layer on a substrate;

forming a tungsten silicide layer with boron ions;

annealing said tungsten silicide layer for a sufficient period of time and temperature to outdiffuse said boron ions and fluorine impurities from said tungsten silicide layer as boron fluoride;

patterning said tungsten silicide layer and said silicon layer into an electrode.

2. The method as described in claim 1 further comprising the forming of a gate oxide layer before said step of forming said silicon layer, wherein said gate oxide layer is between said substrate and said silicon layer.

3. The method as described in claim 1 wherein said silicon layer comprises polysilicon.

4. The method as described in claim 1 wherein said tungsten silicide layer is formed with a thickness in the range of 1–2.5 kÅ.

5. The method as described in claim 1 wherein said tungsten silicide layer is formed with a thickness in the range of 2–2.4 kÅ.

6. The method as described in claim 1 wherein said boron ion implantation step is performed with an implantation energy in the range of 20–100 keV.

7. The method as described in claim 1 wherein said boron ion implantation step is performed with a dose in the range of $10^{12}$–$10^{15}$ atoms/cm$^2$.

8. The method as described in claim 1 wherein said boron ions are implanted with an implantation energy in the range of 27–33 keV.

9. The method as described in claim 1 wherein said boron ion implantation step is performed with a dose in the range of $0.9 \times 10^{14}$–$1.1 \times 10^{14}$ atoms/cm$^2$.

10. The method as described in claim 1 wherein said annealing step is performed in a furnace at a temperature of at least 800° C.

11. The method as described in claim 1 wherein said annealing step is performed in a furnace at a temperature of 900° C.

12. The method as described in claim 1 wherein said annealing step is performed in a nitrogen ambient.

13. A method for reducing resistivity of an electrode comprising:

forming a silicon layer on a substrate;

forming a tungsten silicide layer above said silicon layer;

patterning said tungsten silicide layer and said silicon layer into an electrode;

masking said substrate such that said electrode is exposed; and implanting said tungsten silicide layer of said electrode with boron ions;

after implanting said tungsten silicide layer of said electrode with said boron ions, annealing said tungsten silicide layer for a sufficient period of time and temperature to outdiffuse said boron ions and fluorine impurities from said tungsten silicide layer as boron fluoride.

14. The method as described in claim 13 further comprising the forming of a gate oxide layer before said step of forming said silicon layer, wherein said gate oxide layer is between said substrate and said silicon layer.

15. The method as described in claim 13 wherein said silicon layer comprises polysilicon.

16. The method as described in claim 13 wherein said tungsten silicide layer is formed with a thickness in the range of 1–2.5 kÅ.

17. The method as described in claim 13 wherein said tungsten silicide layer is formed with a thickness in the range of 2–2.4 kÅ.

18. The method as described in claim 13 wherein said boron ion implantation step is performed with an implantation energy in the range of 20–100 keV.

19. The method as described in claim 13 wherein said boron ion implantation step is performed with a dose in the range of $10^{12}$–$10^{15}$ atoms/cm$^2$.

20. The method as described in claim 13 wherein said boron ions are implanted with an implantation energy in the range of 27–33 keV.

21. The method as described in claim 13 wherein said boron ion implantation step is performed with a dose in the range of $0.9 \times 10^{14}$–$1.1 \times 10^{14}$ atoms/cm$^2$.

22. The method as described in claim 13 wherein said annealing step is performed in a furnace at a temperature of at least 800° C.

23. The method as described in claim 13 wherein said annealing step is performed in a furnace at a temperature of 900° C.

24. The method as described in claim 13 wherein said annealing step is performed in a nitrogen ambient.

* * * * *